United States Patent
Fackenthal

(10) Patent No.: US 8,605,490 B2
(45) Date of Patent: Dec. 10, 2013

(54) NON-VOLATILE SRAM CELL THAT INCORPORATES PHASE-CHANGE MEMORY INTO A CMOS PROCESS

(75) Inventor: Richard Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 519 days.

(21) Appl. No.: 12/577,631

(22) Filed: Oct. 12, 2009

(65) Prior Publication Data

US 2011/0085372 A1    Apr. 14, 2011

(51) Int. Cl.
    *G11C 11/00*    (2006.01)
(52) U.S. Cl.
    USPC ........... 365/154; 365/148; 365/156; 365/158; 365/171; 365/173

(58) Field of Classification Search
    USPC .............. 365/154, 156, 148, 163, 189.2, 158, 365/171, 173
    See application file for complete search history.

(56) References Cited

U.S. PATENT DOCUMENTS

| 6,717,844 | B1 * | 4/2004 | Ohtani | 365/158 |
| 7,038,938 | B2 * | 5/2006 | Kang | 365/148 |
| 7,692,954 | B2 * | 4/2010 | Lamorey | 365/154 |
| 7,796,417 | B1 * | 9/2010 | Lewis | 365/148 |
| 2004/0141363 | A1 * | 7/2004 | Ohtsuka et al. | 365/154 |

\* cited by examiner

*Primary Examiner* — Thao Bui
(74) *Attorney, Agent, or Firm* — Schwegman, Lundberg & Woessner, P.A.

(57) ABSTRACT

A SRAM cell having two cross-coupled inverters formed by CMOS technology and first and second chalcogenic elements integrated with the SRAM cell to add nonvolatile properties to the storage cell. The PCM resistors are programmed to the SET state and the RESET state, and upon power-up the SRAM cell takes on the data contained in the PCM cells.

16 Claims, 4 Drawing Sheets

NON-VOLATILE SRAM CELL THAT INCORPORATES PHASE-CHANGE MEMORY INTO A CMOS PROCESS

BACKGROUND OF THE INVENTION

The requirements of increasing functionality and reducing overall system cost can place system constraints on consumer electronics devices. Volatile and nonvolatile memories have been used in consumer devices such as car navigation systems, smart phones, digital cameras, PDAs, and MP3 players, and countless other portable applications. New nonvolatile technologies are being planned for an increasing number of functions in digital consumer devices. These new nonvolatile memories have characteristics that provide capabilities for improvements in these consumer devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
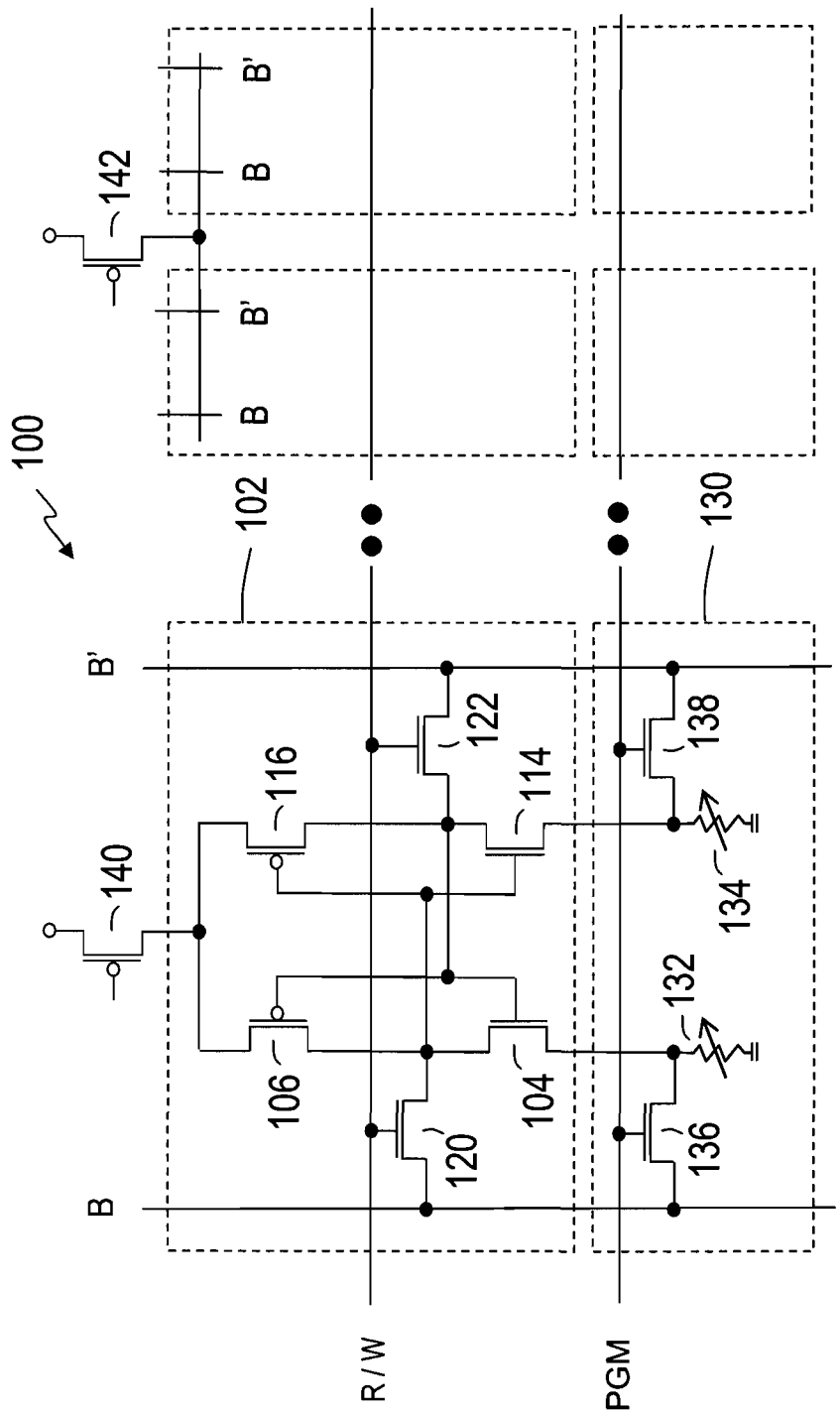
FIGS. 1 and 2 illustrate embodiments of a Static Random Access Memory (SRAM) cell that incorporates Phase-Change Memory materials to provide nonvolatile properties.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

FIG. 1 illustrates an array of enhanced-SRAM (e-SRAM) cells 100 each having a Static Random Access Memory (SRAM) cell 102 that is combined with a Phase-Change Memory (PCM) portion 130 to provide nonvolatile storage properties. PCM may be combined with an SRAM cell that is integrated essentially using a standard CMOS process that adds layers processed after the "front-end" device layers. The PCM sits essentially on top of the SRAM logic and imposes little additional area penalty on a standard SRAM while providing nonvolatility. The PCM material may be integrated on top of the NMOS source or drain contacts in the SRAM cell. This SRAM and PCM memory combination eliminates the need for a separate integrated PCM, an integrated Flash or an off-chip nonvolatile memory.

The PCM cell materials include alloys of elements of group VI of the periodic table, elements such as Te or Se that are referred to as chalcogenides or chalcogenic materials. Chalcogenides may be used advantageously to provide data retention and remain stable even after the power is removed from the volatile SRAM memory. Taking the phase change material as Ge2Sb2Te5 for example, two phases or more are exhibited having distinct electrical characteristics useful for memory storage. In this embodiment the chalcogenic material may be electrically switched between two states, i.e., the amorphous and the crystalline states, giving rise to a nonvolatile storing capability for the enhanced-SRAM (e-SRAM) cell 100.

The figure shows the six-transistor CMOS SRAM cell having two cross-coupled CMOS inverters that store one bit of information. The NMOS transistor 104 and the PMOS transistor 106 form one inverter of the latch and NMOS transistor 114 and the PMOS transistor 116 form the other inverter of the latch. Two NMOS pass transistors 120, 122 are controlled by the Read/Write line (RAN) to pass Bit Line (B) and Bit Line' (B') information into the cell. The Phase Change Memory materials are layered on top of the CMOS devices so that the e-SRAM cell 100 has non-volatile properties provided by the PCM resistive elements 132 and 134. The figure shows pass gate transistor 136 coupled to resistive element 132 and pass gate transistor 138 coupled to resistive element 134. Transistors 136 and 138 are enabled by a program line (PGM) to supply a current provided through a bitline voltage to the selected resistive element that raises a local temperature above a melting temperature of that chalcogenide material. Note that PMOS devices 140 and 142 may be amortized across many cells and in some embodiments may be eliminated from the array.

As long as the PCM portion 130 is unprogrammed, the e-SRAM cell 100 may be read and written in the traditional way as a volatile memory. For instance, in a read mode the R/W line may be activated to read the stored value of the CMOS latch on the bitlines B and B'. The two cross-coupled inverters inside the SRAM cell 102 drive the bitlines, whose value may be read-out. One advantage of SRAM cell 102 is that the data may be read almost as fast as a conventional SRAM cell.

To write new data into the e-SRAM cell 100, the R/W line is activated to enable the transistors 120, 122 to override the previous state of the cross-coupled inverters with the data that is provided on the bitlines B and B'. A subsequent command may be issued to e-SRAM cell 100 to activate the program line PGM and load the latched value of the SRAM cell 102 into the PCM portion 130. After loading PCM portion 130, e-SRAM cell 100 may then be powered down, and power subsequently reapplied where the PCM nonvolatile properties retain the stored data.

In an alternative use, data may be directly written to the PCM portion 130. The loaded data sets PCM resistances that bias the SRAM "off balance" so that when e-SRAM cell 100 powers up, the latch in SRAM cell 102 takes on the data contained in the pair of PCM resistors. Using this method, the SRAM cell combined with the PCM cell is useful in applications that require non-volatility properties while maintaining the high read and write speeds associated with the traditional SRAM. This blending of volatile and non-volatile memories in the same memory cell provides fairly low-densities that have value in embedded logic.

Figure 2:
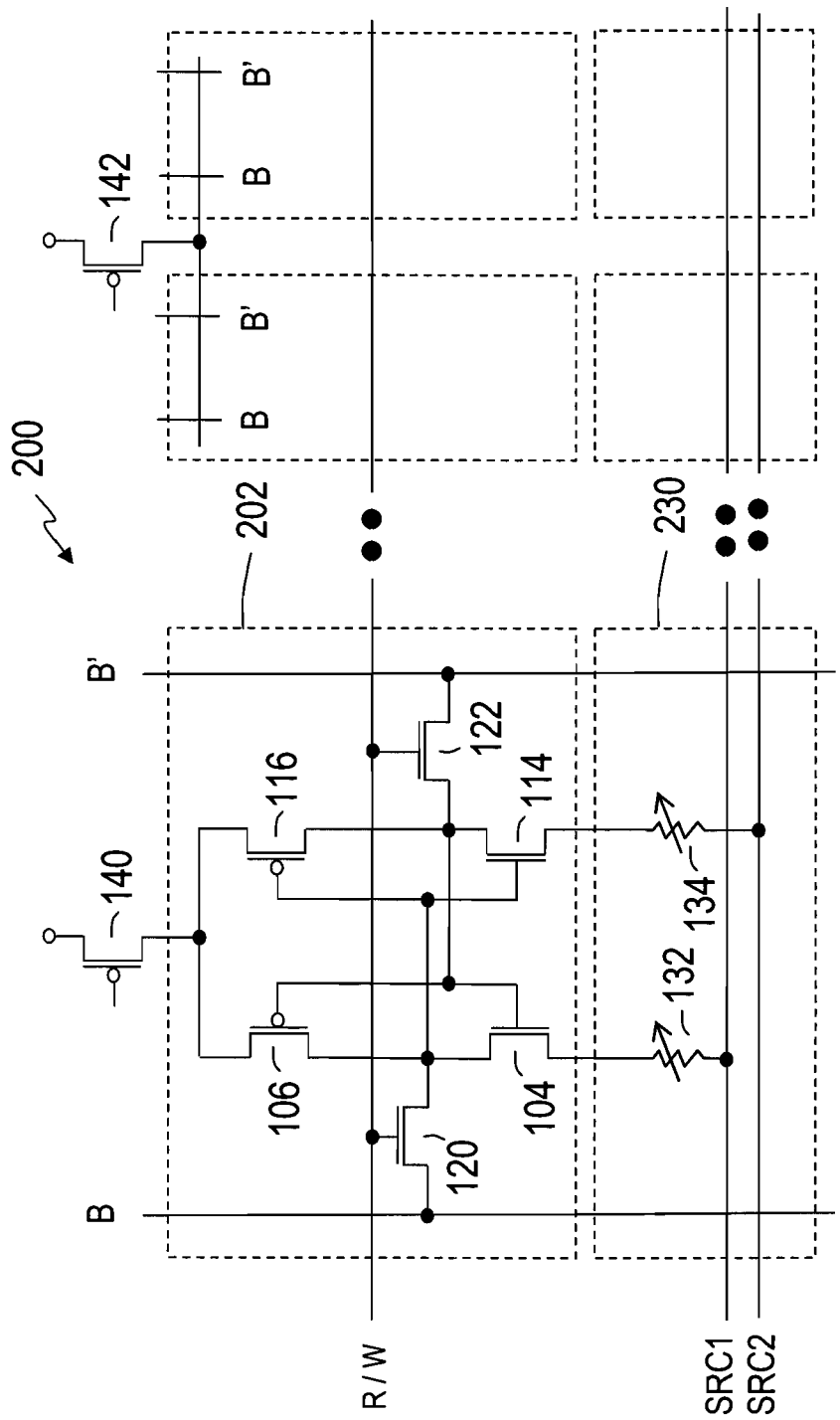

FIG. 2 illustrates another embodiment having PCM material layered into a SRAM cell as evidenced by an array of enhanced-SRAM (e-SRAM) cells 200 each having a Static Random Access Memory (SRAM) cell 202 that is combined with a Phase-Change Memory (PCM) portion 230 to provide nonvolatile storage properties. In this embodiment the PCM resistive element 132 is connected between a source of NMOS transistor 104 and a separate source line labeled SRC1; and the resistive element 134 is connected between a source of NMOS transistor 114 and a separate source line labeled SRC2.

Assume that resistive elements 132 and 134 are programmed to the SET state, i.e., the resistances are both programmed to the low resistance state. With the SRC1 and SRC2 source lines at ground potential (GND) the RAN line and B/B' lines operate in the conventional manor to read and write SRAM cell 202. The e-SRAM cell 200 is volatile and the read/write speeds are similar to state-of-the-art SRAMs.

To make the contents of e-SRAM cell 200 non-volatile, the PCM portion 230 may be written. By way of example, PCM resistive element 132 may remain in the SET condition and be left undisturbed by raising the potential on the SRC1 source line to an 'inhibit' voltage of 4 volts, for example. On the other hand, PCM resistive element 134 may be given a RESET pulse by keeping the SRC2 source line at ground potential.

Pass transistors 120 and 122 may then be activated with 5 volts, for example, on the RAN line that drives the inhibit voltage in pass-through transistor 120. The supply and the N-wells may also be raised to the inhibit voltage of 4 volts to prevent forward biasing in the PMOS transistors 106, 116. NMOS transistor 104 and PMOS transistor 106 conduct no current since with both transistors being biased to the inhibit voltage of 4 volts. The gates of NMOS transistor 114 and PMOS transistor 116 also receive the 4 volts. Pass transistor 122 passes a programming voltage of 3 volts, for example, that is received on B' to be sent through NMOS transistor 114 and PCM resistive element 134. This high-current programming current is sufficient to transition PCM resistive element 134 to the RESET condition. At the end of this program pulse, the bias voltages are quickly removed to allow the cell to quench into the RESET state. With the PCM resistor element 134 in the RESET high-resistance state and PCM resistor element 132 in the SET low-resistance state, the e-SRAM cell 200 may be powered down.

Upon power up, the potential on both SRC1 and SRC2 source lines is held at ground while the supply voltage to e-SRAM cell 200 is ramped. A small current conducts when the NMOS and PMOS devices turn on and a rising potential develops across the high-resistance of PCM resistive element 134 at the source of NMOS transistor 114. As the gate-to-source voltage (Vgs) of transistor 114 decreases relative to the Vgs of the NMOS transistor 104 the drain voltage of NMOS transistor 114 rises. The data is captured upon power-up as the common node between transistors 114, 116 capture a logic "1" and the common node between transistors 104, 106 capture a logic "0". Thus, the symmetry of the SRAM is "off balance" and transitions to the correct state upon power-up as caused by the two different resistances of the PCM cells.

Figure 3:
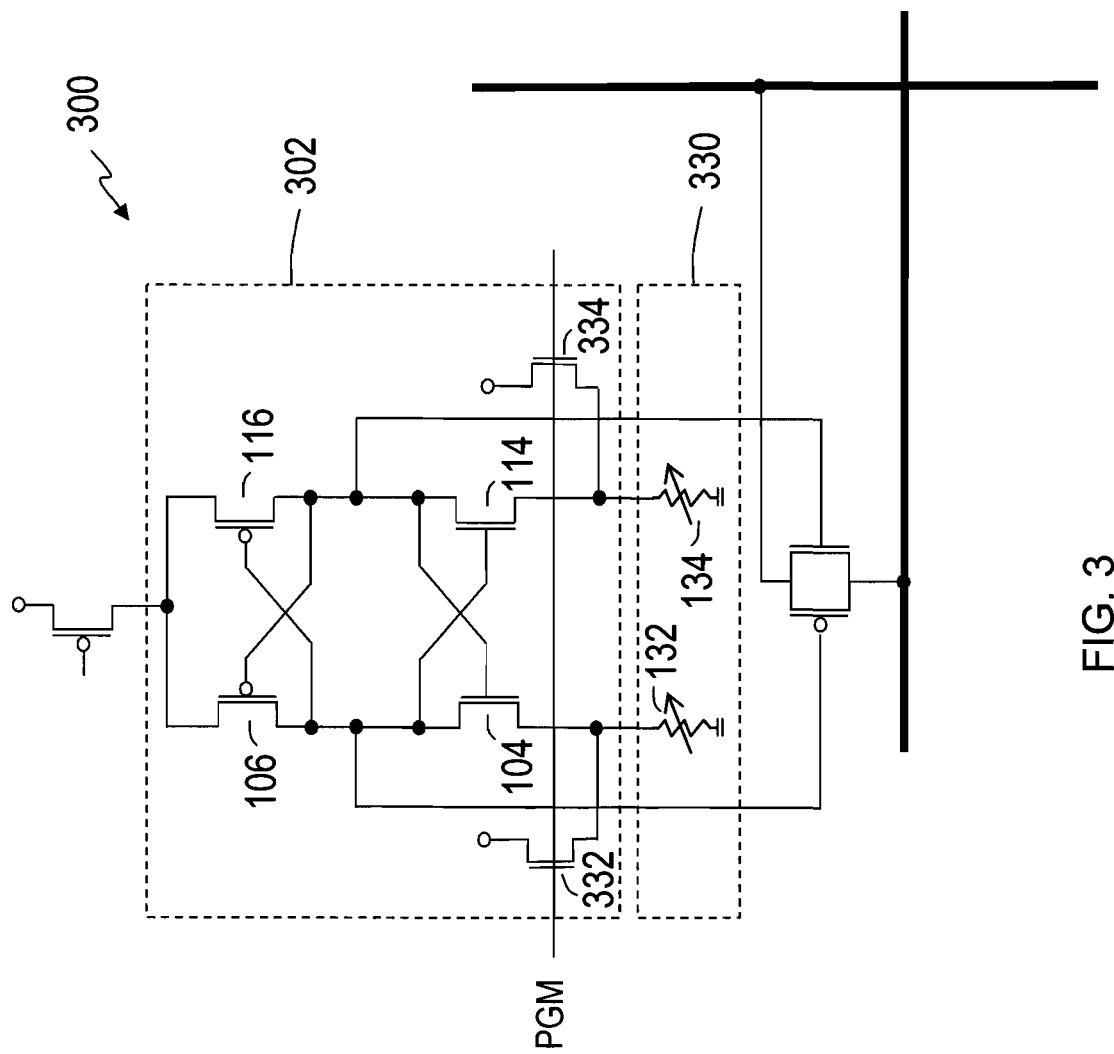
FIG. 3 illustrates an embodiment for a SRAM cell that is combined with a PCM portion where pass gates are dedicated to programming the PCM.

FIG. 3 is yet another embodiment for a SRAM cell 302 that is combined with a PCM portion 330 to provide nonvolatile storage properties. Both of the PCM resistor elements 132 and 134 are connected to ground (GND) in this embodiment. Pass gates 332 and 334 are dedicated to programming the PCM and may be either NMOS or PMOS transistors. This embodiment has a reduced routing advantage, reduced power and voltage dissipation since programming is through only one pass gate device.

Figure 4:
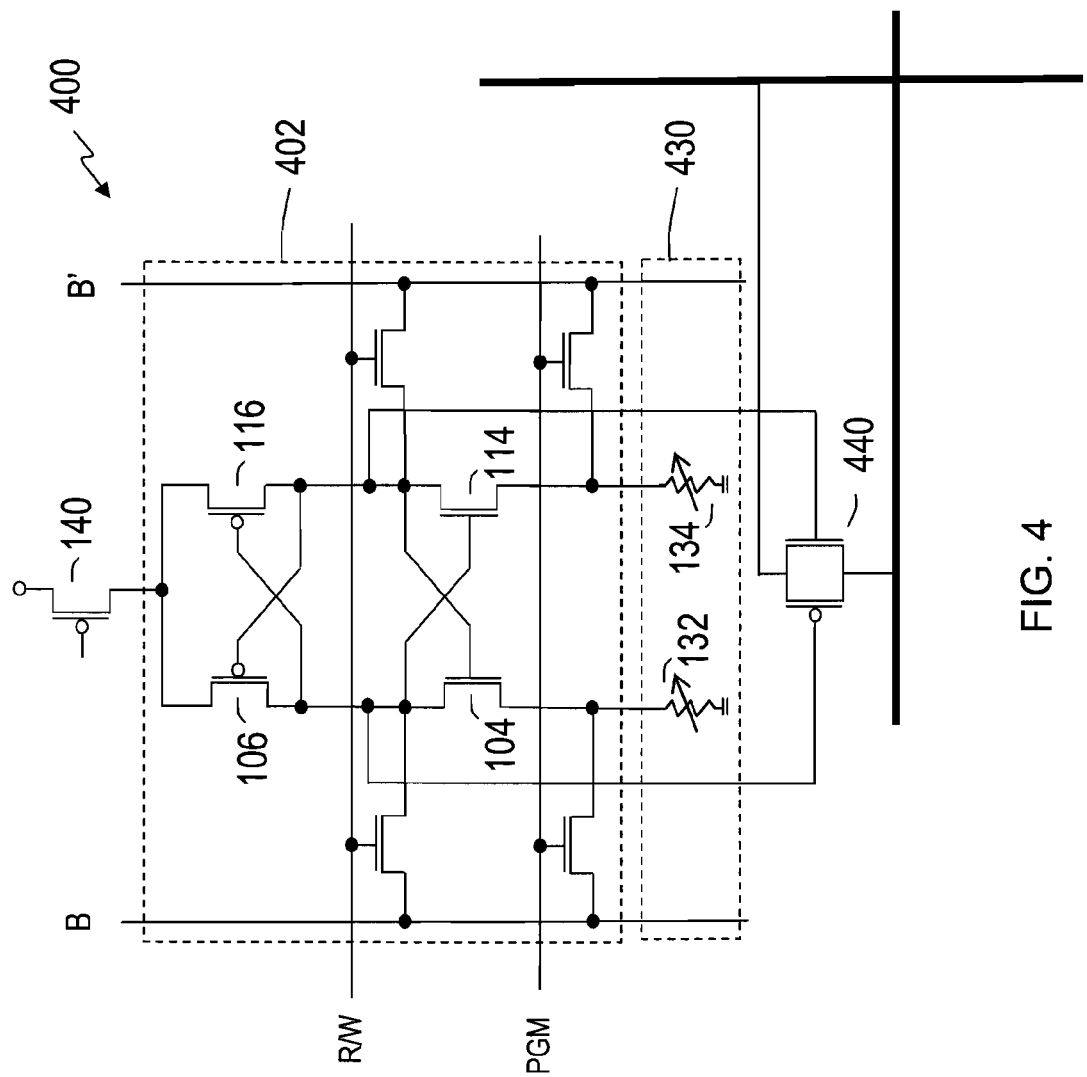
FIG. 4 illustrates using the data stored in the SRAM cell and PCM combination to control a switch in a cross point application.

FIG. 4 is an embodiment for a SRAM cell combined with a PCM portion as illustrated in FIG. 1 with the addition of a switch 440 controlled by the data stored in the SRAM. In this configuration the user may write to the SRAM or to the nonvolatile portion of the cell. Switch 440 may be turned "on" to shunt together two wires by the programming of SRAM cell 402 or PCM portion 430. Switch 440 has applications in Field Programmable Gate Arrays (FPGAs) and other types of programmable logic devices such as Programmable Logic Devices (PLDs) and Programmable Logic Arrays (PLAs). In the FPGA embodiment it may be desirable to only write to the nonvolatile portion of the cell. With the data stored in PCM portion 430, the data in the SRAM latch reflects the PCM states by either powering up the cell or toggling the PMOS transistor 140.

By now it should be apparent that embodiments of the present invention take advantage of PCM's unique capability to integrate easily with standard CMOS processes. Therefore, PCM material may be added to circuitry in CMOS applications that rely on latches such as, for example, Programmable Logic Arrays (PLAs), SRAM arrays, Field Programmable Gate Arrays (FPGAs), cross point switches, among others, to provide a nonvolatile memory functionality. The SRAM cell becomes nonvolatile provided one of the PCM resistors is programmed to the SET state and the other PCM resistor is programmed to the RESET state. Upon power-up the SRAM cell takes on the data contained in the PCM cells and in some embodiments the SRAM may be read/written in the traditional manor.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A storage cell, comprising:
    a Static Random Access Memory (SRAM) cell having two pass transistors and four logic transistors connected in two cross-coupled inverters;
    a Phase-Change Memory (PCM) portion layered onto the SRAM cell to provide the SRAM cell with nonvolatility; and
    a first pass gate transistor that directly couples to a bitline and couples to a source of a first transistor among the four logic transistors and a second pass gate transistor that directly couples to a complemented bitline and couples to a source of a second transistor among the four logic transistors.

2. The storage cell of claim 1 wherein two of the four logic transistors are NMOS transistors each having the source coupled to a first node of chalcogenic material in the PCM portion.

3. The storage cell of claim 2 wherein a second node of the chalcogenic material is coupled to a ground potential.

4. The storage cell of claim 1 wherein gates of the first and second pass gate transistors are commonly activated to program one of the chalcogenic materials to a SET state and the other to a RESET state.

5. The storage cell of claim 4 wherein the SRAM cell takes on the data contained in the PCM portion.

6. The storage cell of claim 1 arrayed into a nonvolatile memory device.

7. The storage cell of claim 1 to form storage for a cross point switch.

8. A storage cell, comprising:
Complementary Metal-Oxide Semiconductor (CMOS) logic to form a volatile memory element having two pass transistors and four logic transistors connected in two cross-coupled inverters;
Phase-Change Memory (PCM) added to the CMOS logic to impart nonvolatile characteristics to the storage cell;
a first pass gate transistor that directly couples to a first bitline and couples to a source of the first NMOS transistor; and
a second pass gate transistor that directly couples to a second bitline and couples to a source of the second NMOS transistor.

9. The storage cell of claim 8 wherein the PCM is chalcogenic elements integrated with the two cross-coupled inverters.

10. The storage cell of claim 9 further including a Read/Write line to enable the first and second pass gate transistors to override a previous state of the cross-coupled inverters.

11. The storage cell of claim 9 wherein resistances of the chalcogenic elements bias the SRAM cell to take on the data contained in the chalcogenic elements.

12. A storage cell, comprising:
a Static Random Access Memory (SRAM) cell having two pass transistors and four logic transistors;
a Phase-Change Memory (PCM) coupled to the SRAM cell;
a first pass gate transistor coupled a source of a first transistor among the four logic transistors and directly coupled to a first bitline; and
a second pass gate transistor coupled a source of a second transistor among the four logic transistors and directly coupled to a second bitline.

13. The storage cell of claim 12, wherein the PCM includes a resistive element coupled to the source of the first transistor.

14. The storage cell of claim 13, wherein the PCM includes an additional resistive element coupled to the source of the second transistor.

15. The storage cell of claim 12, wherein a gate of the first pass gate transistor is coupled to a gate of the second pass gate transistor.

16. The storage cell of claim 12, wherein the two pass transistors include a first pass transistor and a second pass transistor, and a gate of the first pass transistor is coupled to a gate of the second pass transistor.

* * * * *